(12) United States Patent
Kumar et al.

(10) Patent No.: US 12,074,597 B2
(45) Date of Patent: Aug. 27, 2024

(54) FAIL-SAFE PROTECTION ARCHITECTURE FOR HIGH VOLTAGE TOLERANT INPUT/OUTPUT CIRCUIT

(71) Applicant: Synopsys, Inc., Mountain View, CA (US)

(72) Inventors: Kailash Kumar, Hazaribagh (IN); Prateek Singh, Noida (IN); Akhil Thotli, Madanapalle (IN)

(73) Assignee: Synopsys, Inc., Sunnyvale, CA (US)

( * ) Notice: Subject to any disclaimer, the term of this patent is extended or adjusted under 35 U.S.C. 154(b) by 112 days.

(21) Appl. No.: 17/900,427

(22) Filed: Aug. 31, 2022

(65) Prior Publication Data

US 2024/0072803 A1 Feb. 29, 2024

(51) Int. Cl.
*H03K 19/007* (2006.01)
*H03K 19/003* (2006.01)

(52) U.S. Cl.
CPC ..... *H03K 19/007* (2013.01); *H03K 19/00384* (2013.01)

(58) Field of Classification Search
None
See application file for complete search history.

(56) References Cited

U.S. PATENT DOCUMENTS

| | | | |
|---|---|---|---|
| 2019/0305778 A1* | 10/2019 | Chen | H03K 19/00315 |
| 2021/0208615 A1* | 7/2021 | Bogi | G05F 1/575 |
| 2022/0052690 A1* | 2/2022 | Wijetunga | H03K 19/007 |
| 2022/0239290 A1* | 7/2022 | Hsu | H03K 17/165 |

* cited by examiner

*Primary Examiner* — Jany Richardson
(74) *Attorney, Agent, or Firm* — Fenwick & West LLP

(57) ABSTRACT

A circuit provides fail safe protection of an input/output (I/O) circuit of a chip. The I/O circuit comprises an I/O pad connected to one or more other chips via an I/O bus. The circuit comprise a supply and failsafe detector component. The supply and failsafe detector component generates an I/O supply output signal. The I/O supply output signal has a low voltage value when the I/O supply voltage of the chip is below a medium voltage level and the I/O supply output signal having a high voltage value when the I/O supply voltage of the chip is above the medium voltage level. The medium voltage is above a threshold voltage of the transistor of the I/O circuit and below the high voltage value. The circuit uses the I/O supply output signal to provide a reference voltage as input to the transistor of the I/O circuit.

20 Claims, 13 Drawing Sheets

US 12,074,597 B2

FAIL-SAFE PROTECTION ARCHITECTURE FOR HIGH VOLTAGE TOLERANT INPUT/OUTPUT CIRCUIT

BACKGROUND

1. Field of the Disclosure

The present disclosure relates to input/output (I/O) circuits in general and more specifically to fail safe protection of high voltage tolerant I/O circuits.

2. Description of the Related Art

A chip implementing an integrated circuit, for example, a system on chip (SOC) includes peripheral circuits that interact with other chips. The other chips may operate at different voltage levels. As a result, I/O circuits of chips are designed to operate at higher voltage. These I/O circuits are known as high voltage tolerant I/O circuits. These circuits often use low voltage devices, such as field effect transistors (FETs). The devices operating under such conditions are often subjected to voltages that are above their operating voltages. For example, if the voltage supply of the chip is low, the I/O circuit may receive high voltage from other chips. This puts stress on the devices of the I/O circuit resulting in device degradation and possible device breakdown and reduced device lifetime.

SUMMARY

Embodiments relate to fail safe protection of an input/output (I/O) circuit of a chip. The I/O circuit comprises a transistor connected to an I/O pad. The I/O pad is connected to one or more other chips via an I/O bus. The circuit comprise a supply and failsafe detector component. The supply and failsafe detector component includes a first stage, whose input connected to the I/O supply voltage of the chip and supply connected to the I/O pad and receiving an I/O pad voltage. The supply and failsafe detector component generates an I/O supply output signal. The I/O supply output signal has a low voltage value when the I/O supply voltage of the chip is below a medium voltage level and the I/O supply output signal having a high voltage value when the I/O supply voltage of the chip is above the medium voltage level. The medium voltage is above a threshold voltage of the transistor of the I/O circuit and below the high voltage value. The circuit further includes a multiplexer controlled by the I/O supply output signal. The multiplexer provides a reference voltage as input to the transistor of the I/O circuit.

BRIEF DESCRIPTION OF THE DRAWINGS

The teachings of the embodiments can be readily understood by considering the following detailed description in conjunction with the accompanying drawings.

Figure 1:
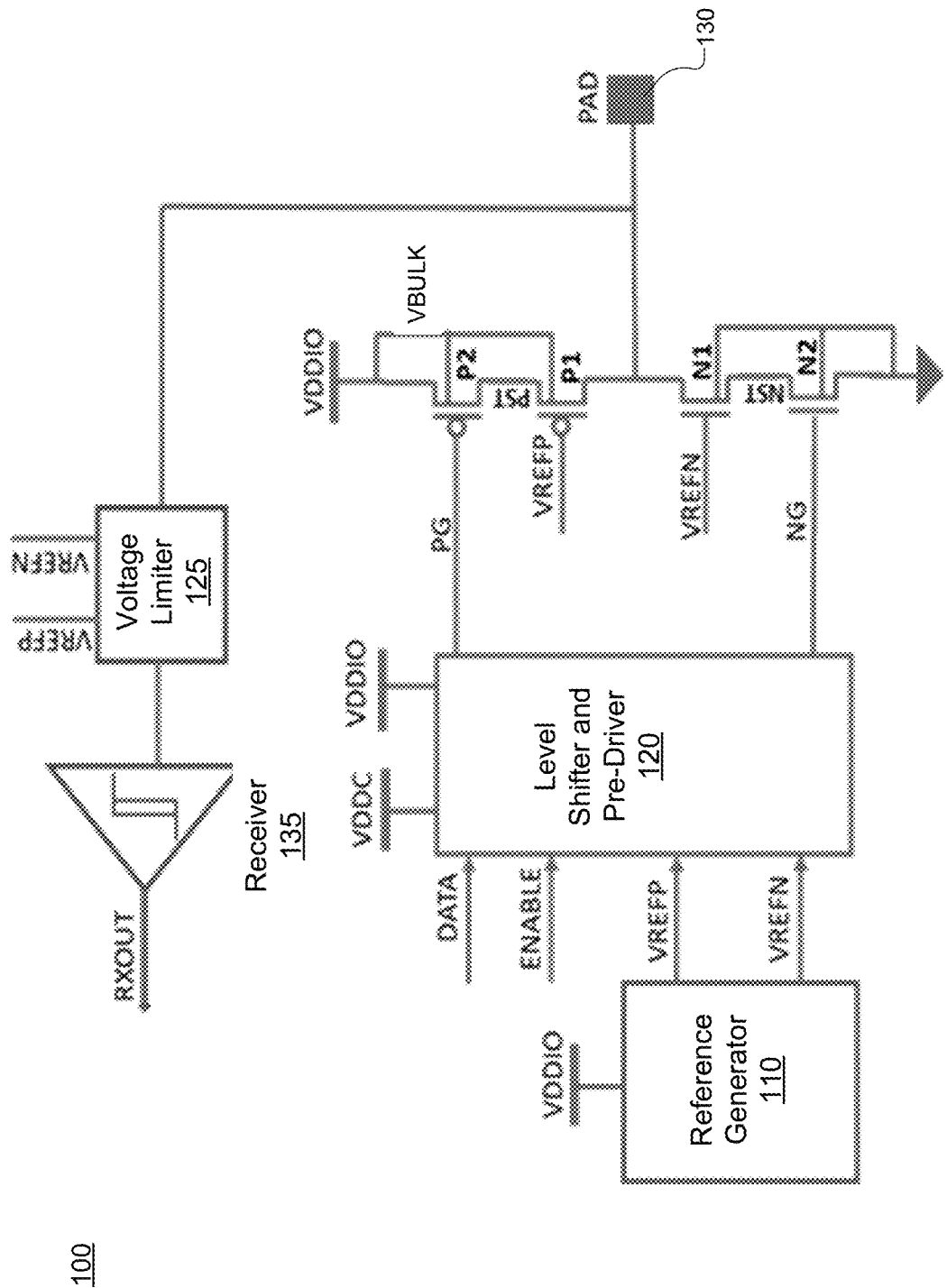
FIG. 1 is a schematic block diagram illustrating the portion of a circuit controlling the I/O of a chip, according to an embodiment.

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

A letter after a reference numeral, such as "125a," indicates that the text refers specifically to the element having that particular reference numeral. A reference numeral in the text without a following letter, such as "125," refers to any or all of the elements in the figures bearing that reference numeral (e.g. "125" in the text refers to reference numerals "125a" and/or "125b" in the figures).

DETAILED DESCRIPTION

Embodiments concern failsafe protection circuits for high voltage tolerant I/O circuits. Examples of circuits protected using the disclosed techniques include a system on chip (SOC). An SOC's peripheral circuits interact with other chips via a bus (or rail) which can operate at different voltages. For example, the SOC's peripheral circuits may have a node called an I/O pad that is connected to the bus. These circuits are designed with I/O circuits operating at higher voltage compared to the core circuit of the chip. These I/O circuits are known as high voltage tolerant I/O circuits.

A failsafe protection circuit protects a circuit in case of failsafe scenarios. For example, the circuits as disclosed protect high voltage tolerant I/O circuits in cases where there is high voltage in an I/O pad but the chip's voltage supply is off resulting in low value (e.g., 0 V) of the voltage supply of the chip. A chip may reduce the power supply voltage to low value either to save power or due to power supply failure while I/O circuit has a high voltage applied to its I/O pad that may be provided by other chips connected to the bus connected to the I/O pad. This scenario causes high stress in the devices of the high voltage tolerant I/O circuit since the input of the devices (e.g., gate of a transistor) may be low but the output voltage (e.g., source of the transistor) is high, thereby creating a voltage difference between the input and output that is higher than the typical voltage difference during normal operation for which the device is designed. Design of fail-safe protection circuit becomes more challenging for high voltage tolerant I/Os, particularly during power supply ramping down or ramping up. During a failsafe scenario in which power supply is ramping up, a device may be turned on as soon as the input of the device reaches the device threshold voltage. This results in the device turning on early. Similarly, during a failsafe scenario in which power supply is ramping down, a device may not be turned off until the input of the device reduces to the device threshold voltage. This results in the device turning off late. This creates stress on the devices during power ramp up and power ramp down sequences. This device stress affects the longevity of the devices, results in device degradation, and may also cause device breakdown.

The circuits as disclosed according to various embodiments include a supply and failsafe detector component in the overall circuit design that reduces device stress. In particular, the failsafe and supply detector shifts the voltage at which the device turns on or off to avoid the device from turning on early and from turning off late. This helps avoid device stress, thereby improving longevity of the device and avoiding device degradation and breakdown.

FIG. 1 is a schematic block diagram illustrating the portion of a circuit controlling the I/O circuit of a chip, according to an embodiment. The chip includes two voltage supplies, a VDDC voltage supply for the core circuit and a VDDIO voltage supply for the I/O circuit. The voltage supply VDDIO used for I/O circuit is typically higher than the VDDC supply of the core circuit. VDDIO is referred to as the I/O voltage supply or the interface voltage supply. For example, VDDIO may be 2.5 volts whereas VDDC may be 0.75. The devices N1, N2, P1, P2 are designed to operate for voltage less than VDDIO. According to an embodiment, the devices N1, N2, P1, P2 are transistors, for example, MOSFETs wherein N1 and N2 are NMOS transistors (i.e., negative-channel MOSFET) and P1 and P2 are PMOS transistors (i.e., positive-channel MOSFET). For example, these devices may tolerate 1.65 V (volts) maximum while VDDIO may be 2.5, i.e., greater than the voltage tolerated by the devices. The circuit 100 includes a reference generator 110 that generates voltages VREFN and VREFP for providing as input to the devices to avoid stress on the devices. The level shifter and pre-driver 120 receives various input signals including DATA, ENABLE, VREFP, VREFN, and performs multiplexing of signals to provide the right signals for driving the devices. The level shifter and pre-driver 120 also performs level shifting, for example, from the lower levels based on VDDC to higher levels based on VDDIO for operating the devices of the I/O circuit. The signals PG and NG generated by the level shifter and pre-driver 120 are used for driving the devices P2 and N2 respectively. The reference voltages VREFP and VREFN are provided as inputs to the devices P1 and N1 respectively. The voltage VREFN is set to the tolerance limit of the devices, e.g., P1, N1. A circuit node PAD 130 is connected to an I/O bus or rail which may be connected to other chips that may operate at different voltages. The devices N1, N2, P1, P2 are part of the I/O circuit that outputs signals of the chip to PAD. The PAD may also provide input signals to the chip that is processed by the voltage limiter 125 and the receiver 135 to generate the signal RXOUT that is processed by the chip. According to an embodiment, VREFP and VREFN are set to values that are a fraction of the VDDIO value, for example, VREFN=0.58*VDDIO and VREFP= VDDIO−VREFN=0.42*VDDIO.

Figure 2:
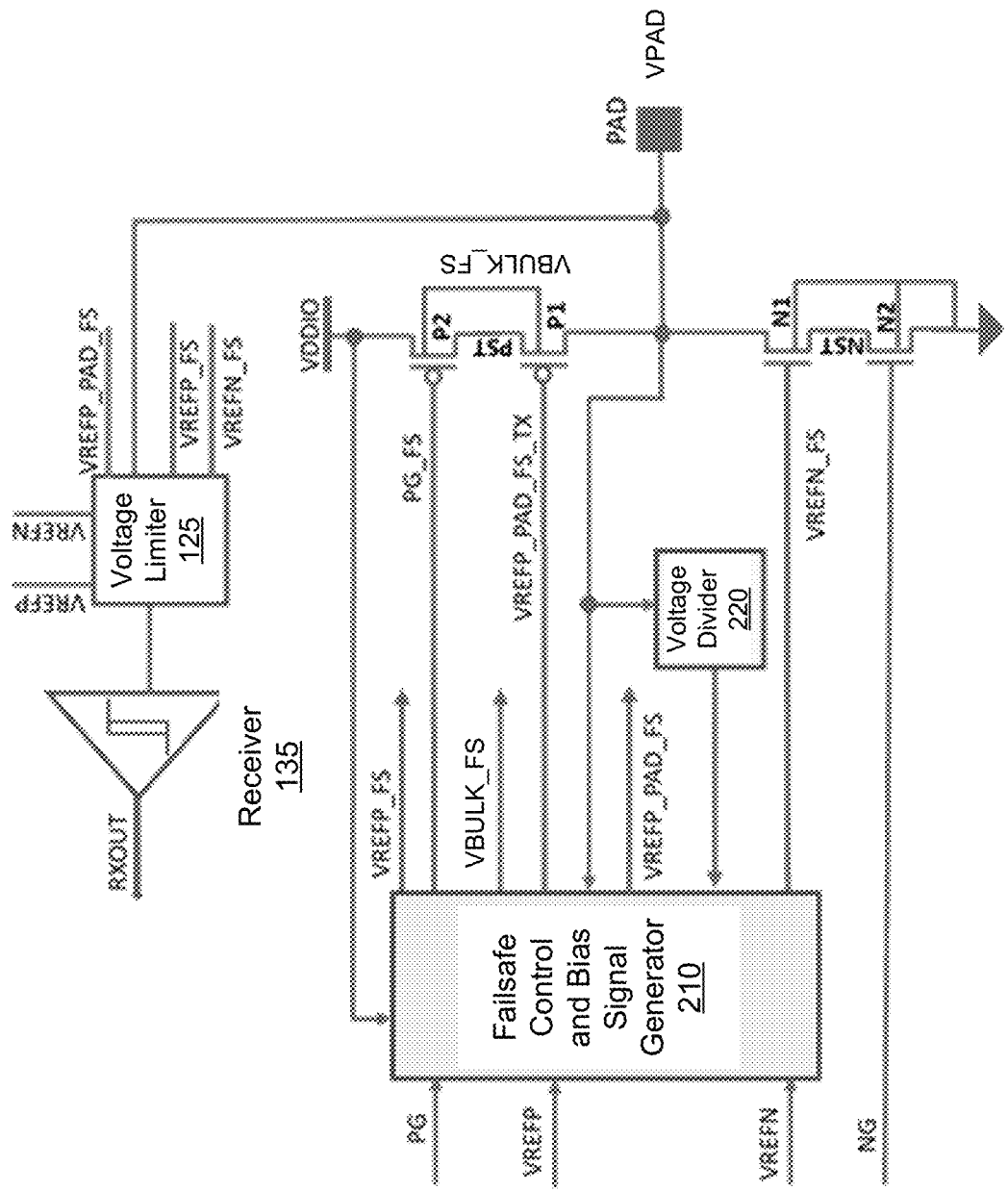
FIG. 2 is a circuit illustrating use of a failsafe control and bias signal generator in a chip, according to an embodiment.

FIG. 2 is a circuit illustrating use of a failsafe control and bias signal generator in a chip, according to an embodiment. The failsafe control and bias signal generator 210 may be added to the chip shown in FIG. 1 for ensuring that the devices are protected from stress caused by failsafe scenarios. The PAD node in the I/O circuit is connected to a bus or a rail that may be connected to other chips. Multiple I/O circuits of different chips drive the same bus. Accordingly, if the VDDIO of the chip shown in FIGS. 1-2 is low (e.g., zero), it is possible that PAD is receiving high voltage from I/O circuit of another chip. Accordingly, PAD has high voltage VPAD and VDDIO has low voltage resulting in a voltage difference of the (VPAD−VDDIO) across the gate and drain of the device P2. The voltage difference (VPAD− VDDIO) is higher than the maximum operational voltage of the device P2 resulting in stress on the device. Conventional failsafe control and bias signal generators 210 are able to protect the devices in DC (direct current) situations where the voltages VDDIO and VPAD have stabilized to constant values and are not changing. However conventional failsafe control and bias signal generators 210 are unable to protect the devices in scenarios when the voltages VDDIO ramping up or ramping down, for example, increasing from a low voltage value to a high voltage value or decreasing from a high voltage value to a low voltage value.

In DC situation, the voltage divider 220 receives the voltage VPAD from PAD of the I/O circuit and generates the reference voltages as input to the failsafe control and bias signal generator 210. The failsafe control and bias signal generator 210 in turn generates reference voltages to protect the devices connected to the PAD of I/O circuit, for example VREFN_FS and VREFP_PAD_FS_TX for devices N1 and P1. As a result, the stress on the devices is reduced since the difference in voltage between gate and drain or gate and source is reduced as a result of applying the reference voltages to the gates of the devices. The failsafe control and bias signal generator 210 may generate other signals such as VBULK_FS that is provided to the bulk of the devices for reducing the device stress and leakage current. The failsafe control and bias signal generator 210 includes multiplexers that switch between the signals generated from VDDIO and signals generated from VPAD to ensure that the proper signal is provided to the devices to reduce the device stress. For example, a multiplexer M1 may be used to select one of the signals VREFN or VPADN to generate VREFN_FS and provide as input to the gate of device N1, another multiplexer M2 may be used to select one of the signals VREFP or VPAD to generate VREFP_PAD_FS_TX and provide as input to the gate of device P1, and another multiplexer M3 may be used to select one of the signals VDDIO or VPAD to generate VBULK_FS and provide as input to the bulk of device P1 and P2.

FIG. 2 shows the failsafe control and bias signal generator 210 along with driver comprising P1, P2, N1 and N2 used for transmitting the outputs signal generated by the core circuit of the chip to other chips via the I/O pad. Similarly, the failsafe control and bias signal generator 210 may be used for a receiver 135 that processes signals received from the I/O pad that are provided as input to the chip. The receiver 135 receives signals from the I/O pad, for example, signals generated by other chips and passes the received signal to the core circuit of this chip as signal RXOUT. The signals VREFP_FS, VREFN_FS, and VREFP_PAD_FS generated by the failsafe control and bias signal generator 210 are also used by the receiver 135 for controlling the device stress of the devices that process the signal received from the I/O pad.

Figure 3:
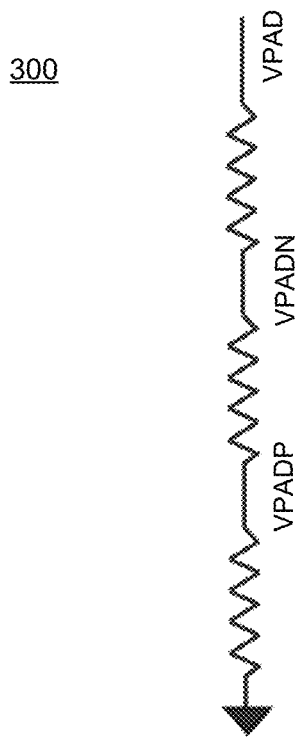
FIG. 3 shows an example voltage divider circuit according to an embodiment.

FIG. 3 shows an example voltage divider circuit 300 according to an embodiment. The circuit 300 comprises a set of resistors or equivalent device. The signal VPAD obtained from the I/O pad is divided by the circuit 300 into two signals VPADN and VPADP. The signal VPADN corresponds to the signal VREFN and the signal VPADP corresponds to the signal VREFP.

Figure 4:
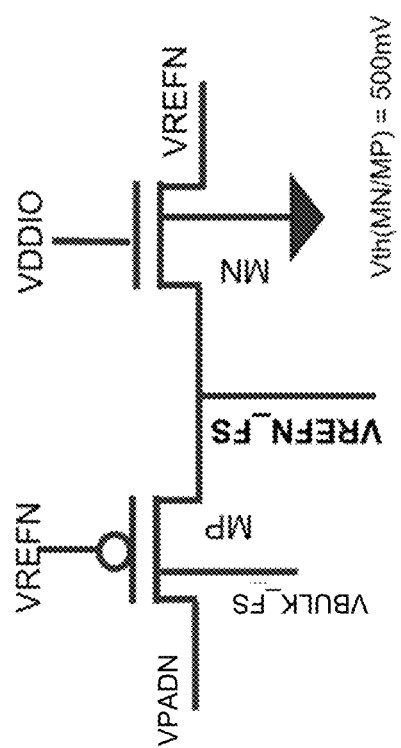
FIG. 4 shows a multiplexer circuit for generating signals provided to the devices according to an embodiment.

FIG. 4 shows a multiplexer circuit 400 for generating signals provided to the devices according to an embodiment. The multiplexer circuit includes a device MP that is a PMOS transistor and a device MN that is an NMOS transistor. The drain of the device MP is connected to the drain of the device MN. The source of the device MP receives the signal VPADN and the source of the device MN receives the signal VREFN. The gate of the device MP receives the signal VREFN and the gate of the device MN receives the signal VDDIO.

The multiplexer circuit 400 shown in FIG. 4 is part of the failsafe control and bias signal generator 210. The multiplexer circuit 400 shown in FIG. 4 generates the signal VREFN_FS. Similar multiplexer circuits are part of the failsafe control and bias signal generator 210 and are used to generate signals VREFP_FS, VBULK_FS, VREFP_PAD_FS, and other signals that may be output by the failsafe control and bias signal generator 210. The multiplexer circuit includes two transistors MP and MN. The drain of MP is connected to the drain of MN transistor and provides the VREFN_FS signals. The source of MP transistor receives the VPADN signal and the source of the MN transistor receives the VREFN signal. The gate of the MP transistor receives the VREFN signal as input and the gate of the MN transistor receives VDDIO as input. The bulk of the MP transistor outputs the VBULK_FS signal. Furthermore, the width of the transistor MN is greater than the width of the transistor MP allowing MN to provide a lower resistance path when the transistor is on. The device MN with greater width compared to the width of another device MP, MN is also referred to as a stronger device whereas MP is weaker compared to the MN. The device MN is kept stronger (higher width) to handle coupling on VREFN_FS signal in a non-failsafe scenario. This allows VREFN_FS to be driven mainly by VREFN and not by VPADN during non-failsafe scenarios.

In failsafe scenarios, VREFN_FS is driven by VDAPN. The transistor MP is weaker (has less width). As a result, the path from the source to drain of the transistor MN has low resistance compared to a corresponding path provided by transistor MP and is able to pass the VREFN signal as VREFN_FS signal with maximum strength through low resistance. Accordingly, device MP is able to handle the failsafe scenario since the signal does not toggle often in failsafe scenario and even a weak device MP is able to provide the signal VPADN as the VREFN_FS signal. Furthermore, the threshold voltage Vth of the transistors MN and MP is a small fraction of VDDIO, for example, Vth may be 0.5V. The threshold voltage Vth of a field effect transistor (FET) is the minimum gate-to-source voltage that is needed to create a conducting path between the source and drain terminals.

The multiplexer circuit receives VPADN signal generated by the voltage divider based on the VPAD signal. VREFN signal is generated from the VDDIO signal. The multiplexer circuit shown in FIG. 5 generates the VREFN_FS (i.e., VREFN failsafe) signal from the VDAPN and the VREFN signals. The VREFN_FS signal is provided to the devices to reduce device stress.

Figure 5:
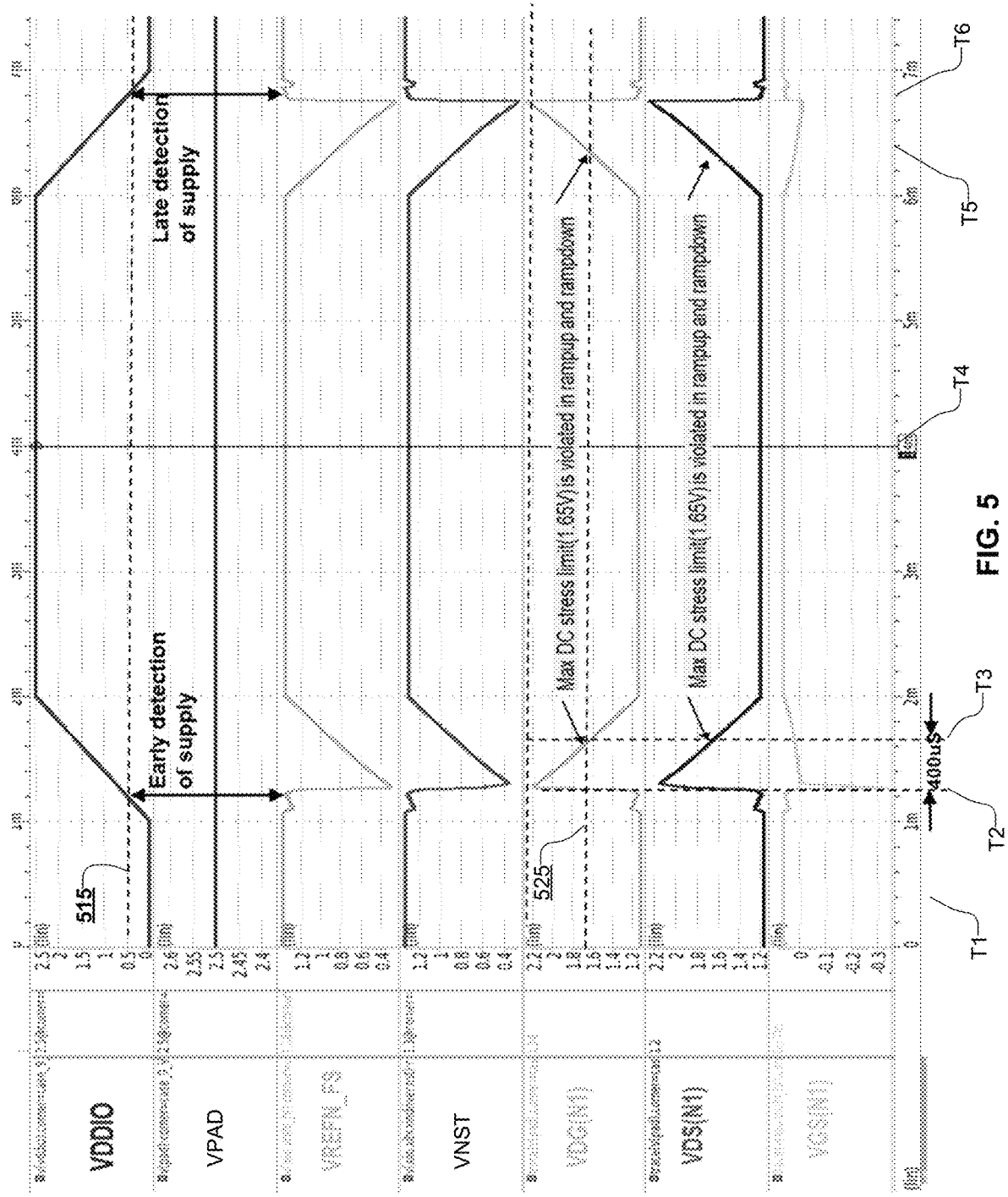
FIG. 5 is a timing diagram illustrating the signals at various nodes of the circuits of FIGS. 2 and 4, according to an embodiment.

FIG. 5 is a timing diagram illustrating the signals at various nodes of the circuits of FIGS. 2 and 4, according to an embodiment. The operations of the circuits are explained in connection with the timing diagrams. When the voltage supply VDDIO is low (e.g., zero), for example, at time T1 as shown in FIG. 5, the voltage VREFN that is generated from VDDIO is also low (e.g., zero). As a result, transistor MP is on but transistor MN is off. As a result, the transistor MP passes the signal VPADN as the VREFN_FS signal. When VDDIO signal is high (e.g., 2.5 V) as shown at time T4 in FIG. 5, the MN transistor is on and the MP transistor is off and accordingly, the VREFN signal is passed through the transistor MN as the VREFN_FS signal. At time T1 and T4, the circuit shows the DC behavior since the signal is steady and not changing.

The signals during the time intervals T2 to T3 illustrate the device stress generated during power ramp up and the signals during the time intervals T4 to T5 illustrate the device stress generated during power ramp down. At T1 the VDDIO voltage is low (e.g., 0 V) and VPAD is high (e.g., 2.5 V). During power ramp up, the VDDIO signal starts increasing from the low voltage (e.g., 0 V) to a high voltage (e.g., 2.5 V). The VDDIO signal is provide as input to the gate of MN transistor. When the VDDIO signal reaches the threshold voltage Vth (shown as voltage level 515), the transistor MN turns on. This causes the resistance from the source to drain of the transistor MN to drop. The voltage VREFN is derived from VDDIO and is therefore a fraction of VDDIO. For example, if Vth is 0.5 V, the VREFN at that point may be 0.3 V. Since MN is a strong device (low resistance), this causes the VREFN_FS signal to drop to a value close to the VREFN signal. Accordingly as shown in FIG. 5, at time T2, the voltage of VREFN_FS drops from 1.3 V to 0.3 V. This also causes the voltage VNST of the NST node shown in FIG. 2 to drop. Since VREFN_FS drops, the gate of device N1 in FIG. 2 is low (e.g., at 0.3 V) but the drain is at a high voltage of VPAD (e.g., 2.5) resulting in a voltage different VDG(N1) between drain and gate of device N1 increases from 1.2 to 2.2. As a result the voltage between drain and gate for device N1 increases to a level above the level 525 that represents the maximum DC stress limit (e.g., 1.65V) for the device during the time interval between T2 and T3. Similarly the voltage between the drain and source VDS(N1) for device N1 also increases above the maximum DC stress limit (1.65V) during the time interval between T2 and T3. A similar increase in voltages VDG(N1) and VDS(N1) is observed during the ramp down phases of VDDIO during the time interval between T5 and T6. This issue may not be observed if the device tolerance is high. But for devices that have lower tolerance, the occurrence of device stress in these situations is observed. Furthermore, this occurrence is increasing as device tolerances are reducing as devices operating at lower voltages are increasingly used.

A multiplexer circuit similar to the circuit shown in FIG. 4 may be used in the failsafe control and bias signal generator 210 that receives VPADP and VREFP signals as input instead of VPADN and VREFN signals shown in FIG. 4 and generates VREFP_FS signal.

Figure 6:
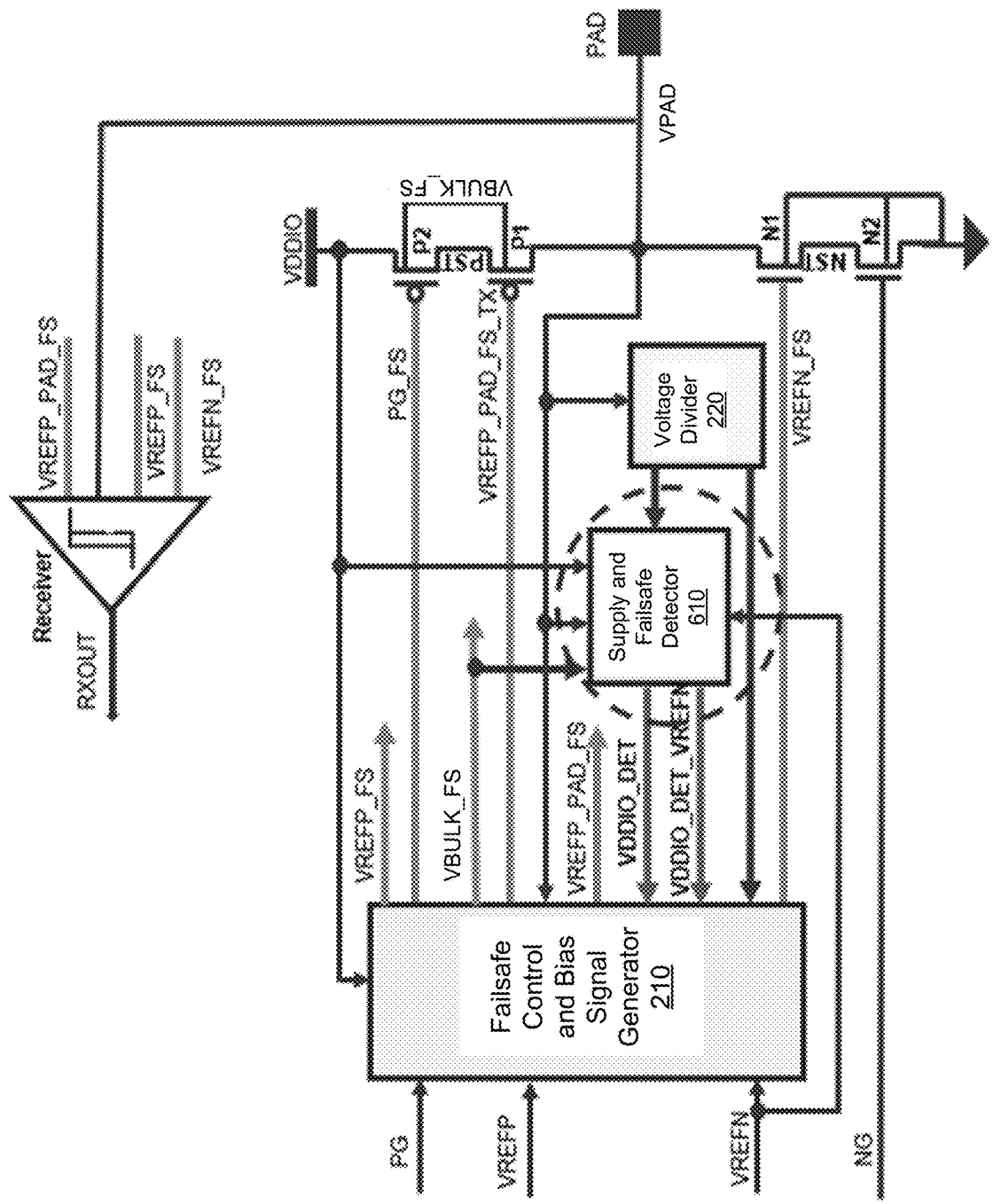
FIG. 6 is a circuit illustrating use of a supply and failsafe detector in a chip, according to an embodiment.

FIG. 6 is a circuit illustrating use of a supply and failsafe detector in a chip, according to an embodiment. The supply and failsafe detector component 610 receives inputs including VDDIO, VPAD, and output of the voltage divider 220 and generates signals VDDIO_DET and VDDIO_DET_VREFN that are provided as inputs to the multiplexer as shown in FIG. 7.

Figure 7:
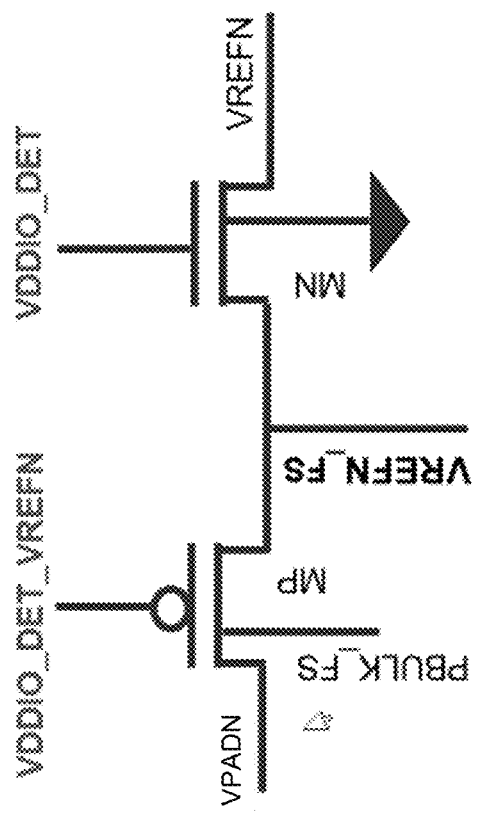
FIG. 7 shows a multiplexer circuit for generating signals provided to the devices that receives signals generated by the supply and failsafe detector component according to an embodiment.

FIG. 7 shows a multiplexer circuit 700 for generating signals provided to the devices that receives signals generated by the supply and failsafe detector component 610 according to an embodiment. The multiplexer 700 is similar in configuration to the multiplexer circuit 400 shown in FIG. 4 except that the signal VDDIO_DET_VREFN is provided as input to the gate of the device MP and the signal VDDIO_DET is provided as input to the gate of device MN. The supply and failsafe detector 610 is configured so that the output VDDIO_DET goes high only if the VDDIO signal goes above a medium threshold voltage value that is above the threshold of the device MP, for example, the medium threshold voltage value is 1.5 volts. Furthermore, the VDDIO_DET signal stays at a low voltage value (e.g., 0 V) if VDDIO is below the medium threshold voltage value. The VDDIO_DET_VREFN is obtained from VDDIO_DET through a clipper circuit, the high of VDDIO_DET_VREFN=0.58*VDDIO, T.

Figure 8:
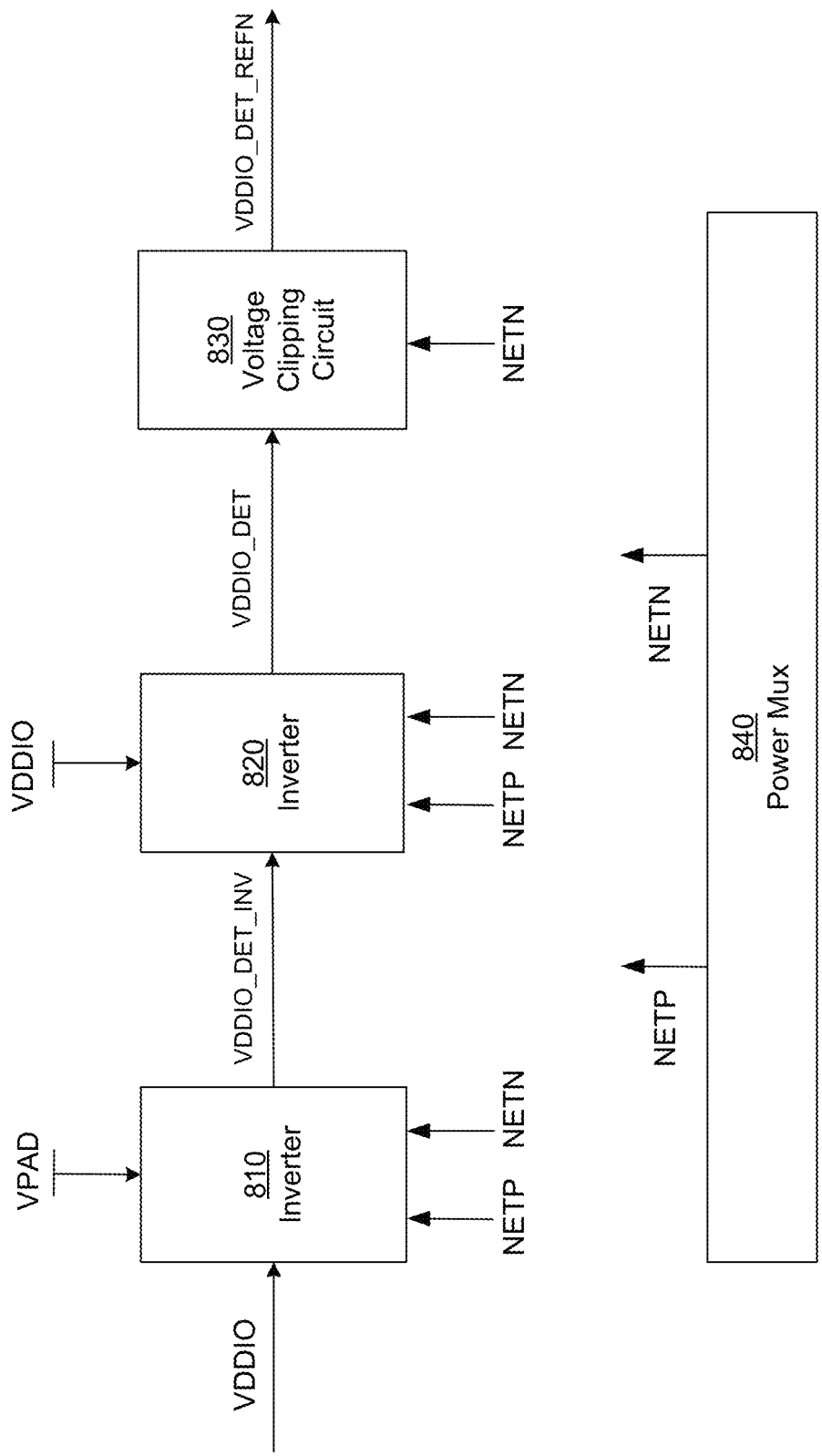
FIG. 8 is a block diagram of a circuit of a supply and failsafe detector, according to an embodiment.
Figure 9:
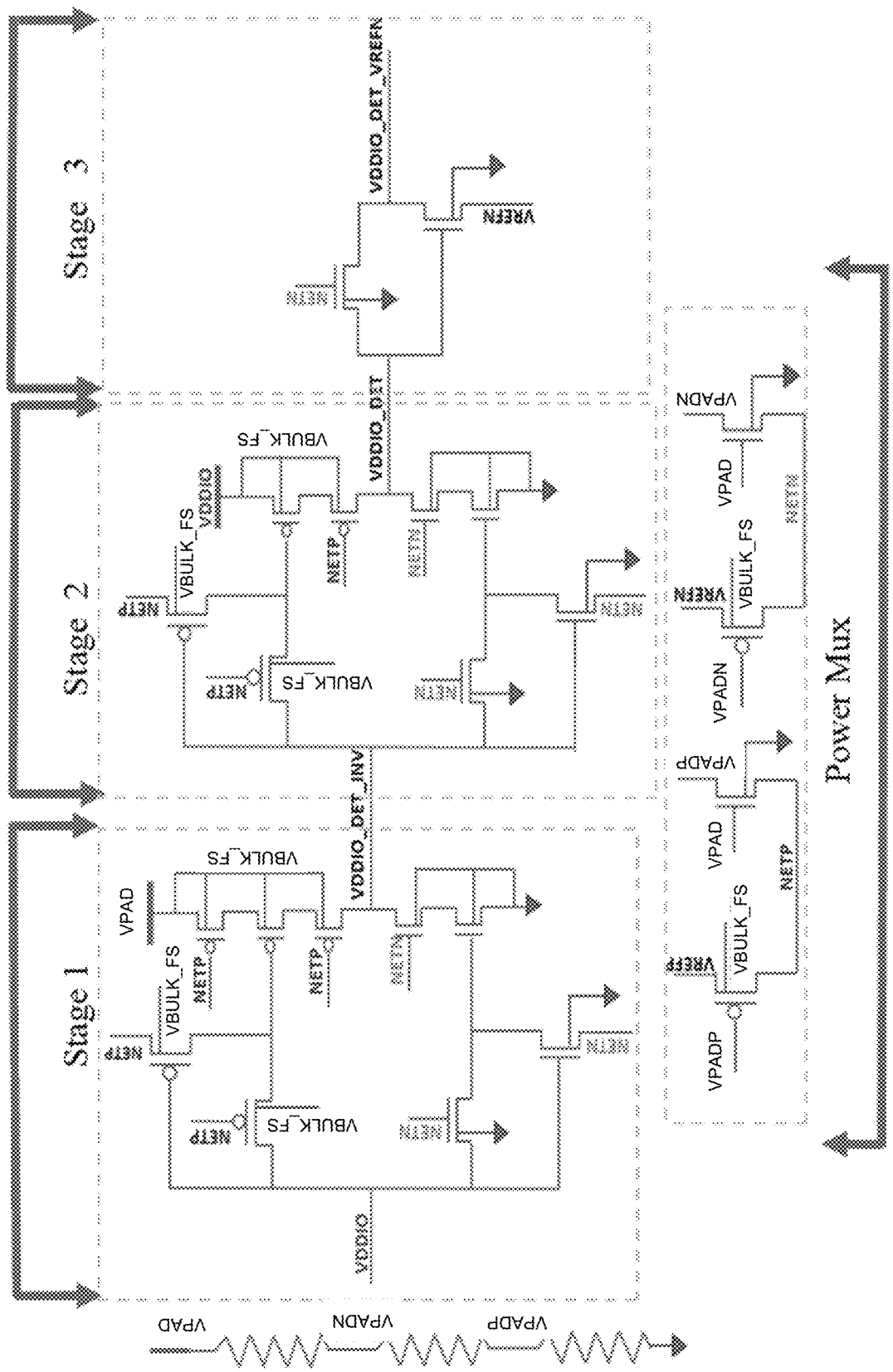
FIG. 9 is a circuit diagram of a circuit of a supply and failsafe detector, according to an embodiment.

FIG. 8 is a schematic diagram of a circuit of a supply and failsafe detector, according to an embodiment. The supply and failsafe detector 610 includes an inverter 810 (referred to as stage 1 in FIG. 9), another inverter 820 (referred to as stage 2 in FIG. 9), a voltage clipping circuit 830 (referred to as stage 3 in FIG. 9), and a power multiplexer (mux) 840. FIG. 9 is a circuit diagram of a circuit of a supply and failsafe detector, according to an embodiment. The components of the FIG. 8 are explained in connection with the circuit of FIG. 9. NETN and NETP signals are generated to protect devices in 810, 820 and 830. NETP is equivalent to maximum of VRFEFP and VPADP and NETN is maximum of VREFN and VPADN as shown in FIG. 9.

The inverter 810 receives VDDIO as the input and VPAD and the power supply and outputs VDDIO_DET_INV signal. The VDDIO_DET_INV signal has high voltage when the VDDIO input of the inverter 810 is low and the VDDIO_DET_INV signal has low voltage when the VDDIO input of the inverter 810 has high voltage. An example high voltage value is 2.5 V and an example low voltage values is zero volt. The VDDIO_DET_INV signal stays high for values of VDDIO signal that are below a medium threshold value that is between the high voltage and the low voltage. The VDDIO_DET_INV signal becomes low for values of VDDIO signal that are above the medium threshold value. The inverter 820 receives the output VDDIO_DET_INV of the inverter 810 and inverts it to generate the output VDDIO_DET. Accordingly, when VDDIO_DET_INV value is high, VDDIO_DET is low and when VDDIO_DET_INV value is low, VDDIO_DET is high. As a result, the VDDIO_DET signal stays low for values of VDDIO signal that are below the medium threshold value and the VDDIO_DET signal becomes high for values of VDDIO signal that are above the medium threshold value.

Figure 10:
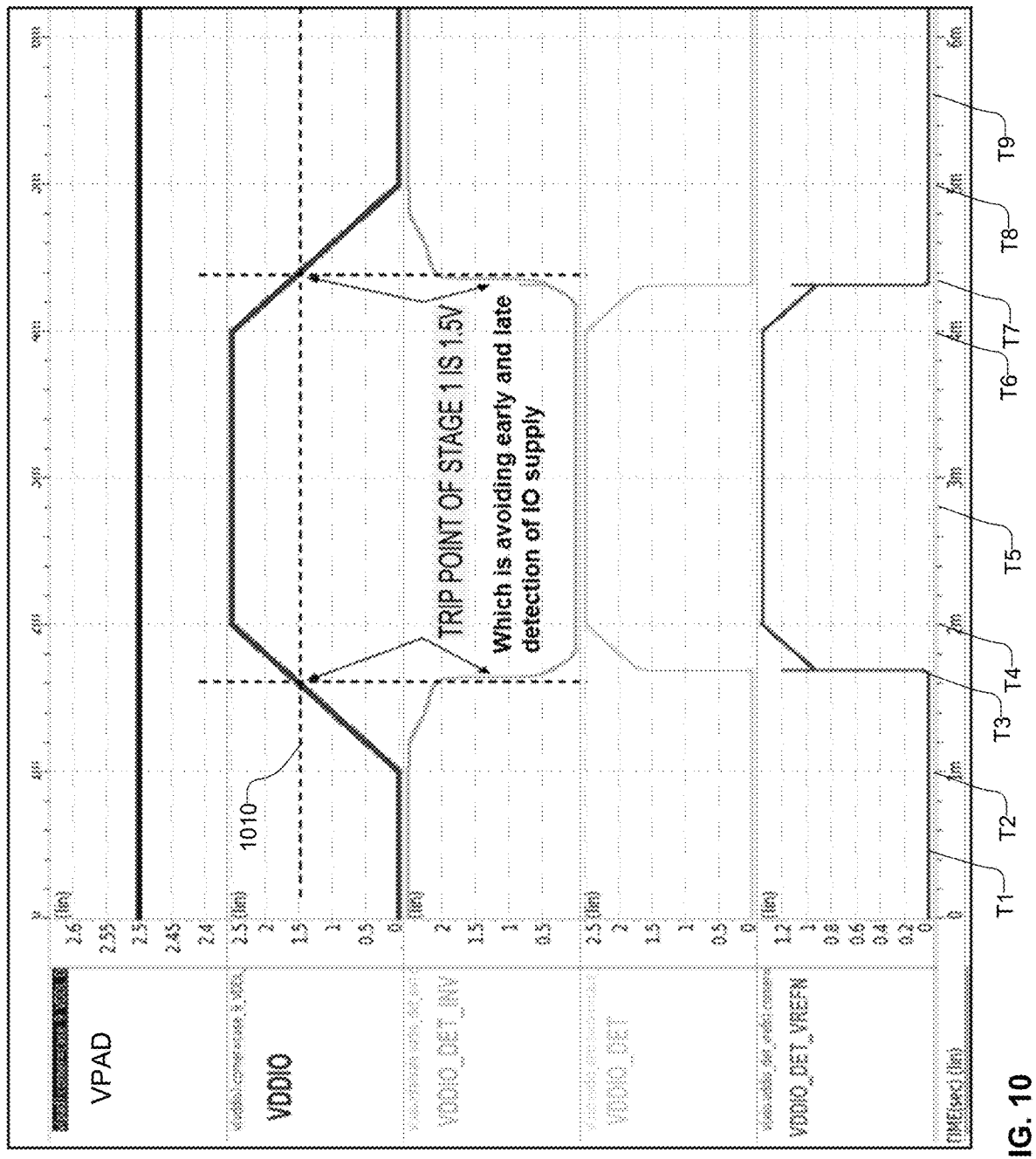
FIG. 10 is a timing diagram illustrating the signals at various nodes of the circuits of FIGS. 8 and 9, according to an embodiment.

FIG. 10 is a timing diagram illustrating the signals at various nodes of the circuits of FIGS. 8 and 9, according to an embodiment. As shown in FIG. 10, the VPAD signal stays high at 2.5 V value. The VDDIO signal is low at time T1. The VDDIO signal ramps up from the low value to high value from T2 to T3 and further to T4. The VDDIO signal stays high between T4 and T6, for example, at time T5. The VDDIO signal ramps down from the high value to low value from T6 to T7 and further to T8. The VDDIO signal stays low after T8, for example, at time T9. When the VDDIO signal ramps up from T2 to T3, the VDDIO_DET signal stay slow until time T3 since VDDIO is below the medium threshold value 1010 (e.g., 1.5 V) during this time interval. After VDDIO signal reaches a value above the medium threshold value 1010, i.e., after time T3, the VDDIO_DET signal reaches a high value that increases along with the increase in the VDDIO signal between time T3 and T4. After T4, the VDDIO_DET signal stays high at 2.5 value. Similarly during ramp down of VDDIO, the VDDIO_DET signal stays high but tracks VDDIO as VDDIO falls between time T6 to T7, i.e., so long as VDDIO is above the medium threshold value. Between time T7 and T8, the VDDIO signal continues to fall but is below the medium threshold value. As soon as the VDDIO signal reaches below the medium threshold value at time T7, the VDDIO_DET signal drops to a low value. Accordingly, the VDDIO_DET signal stays low after time T7, for example, even when VDDIO signal has not reached low value during the time interval between T7 to T8.

The power mux 840 receives VDADP, VREFP, and VPAD signals as input to generate the NETP signal and also receives VDADN, VREFN, and VPAD signals as input to generate the NETN signal. The NETP signal corresponds to the VREFP signal when VPADP signal has low value and the NETP signal corresponds to the VPADP signal when VPAD signal has high value. Similarly, the NETN signal corresponds to the VREFN signal when VPADN signal has low value and the NETN signal corresponds to the VPADN signal when VPAD signal has high value. The NETP and NETN signals are provided as input to the inverters 810 and 820.

Figure 11:
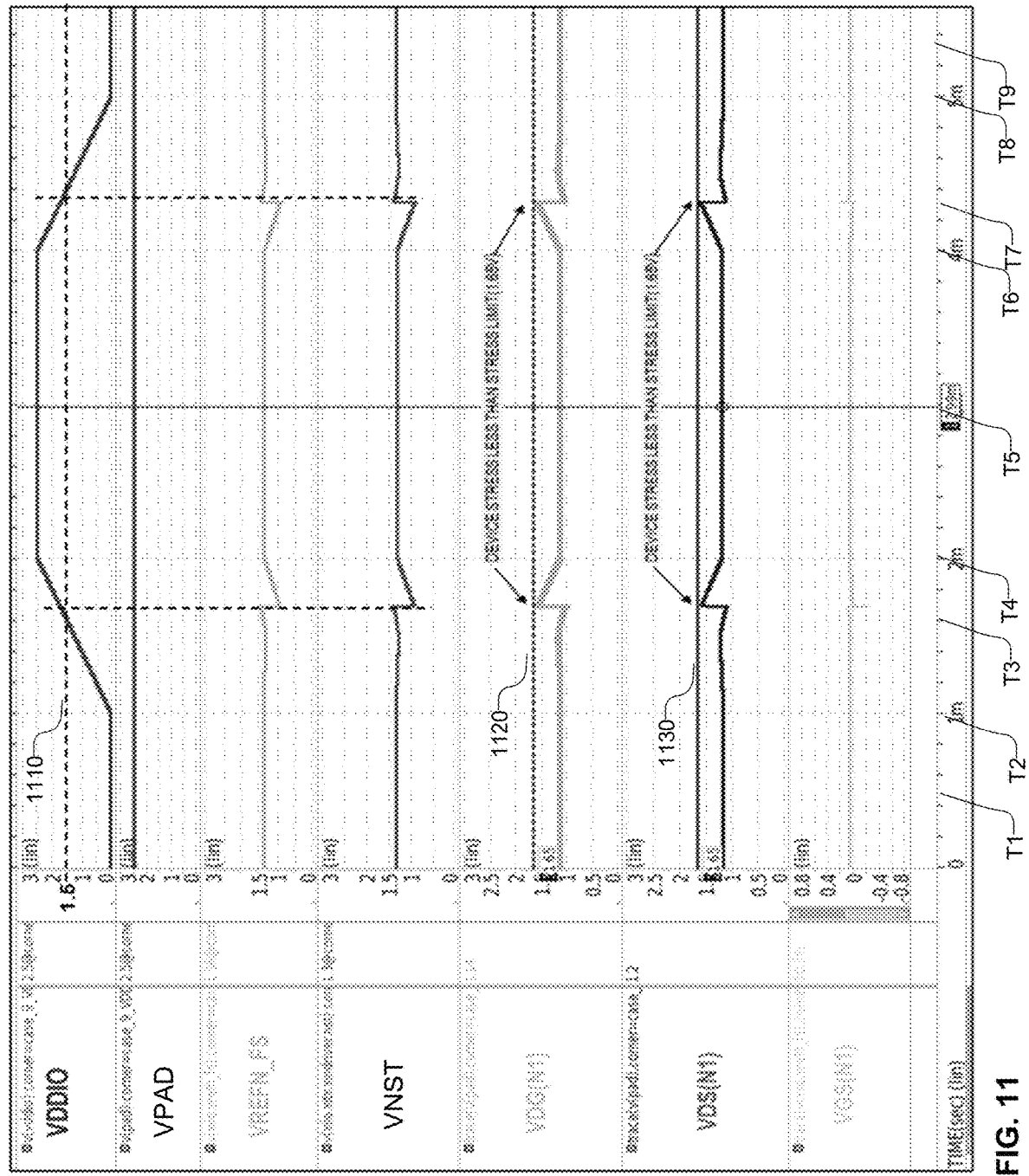
FIG. 11 is a timing diagram illustrating the signals at various nodes of the circuit of FIG. 6, according to an embodiment.

FIG. 11 is a timing diagram illustrating the signals at various nodes of the circuit of FIG. 6, according to an embodiment. Since the circuit of FIG. 6 includes the supply and failsafe detector, the devices do not encounter stress that was observed in the circuit of FIG. 2. The voltage VDDIO ramps up from a low voltage to a high voltage value during the time interval T2 to T4 and then ramps down from high voltage to low voltage value during the time interval T6 to T8, and the VPAD signal stays high, similar to the signals shown in FIG. 5. However, unlike the timing diagram of FIG. 5, the VREFN_FS signal shown in FIG. 11 does not drop suddenly when the voltage VDDIO ramps up from a low voltage to a high voltage value. The signal VREFN_FS stays high while the signal VDDIO ramps up from low to high until VDDIO reaches the medium threshold voltage 1110 (e.g., 1.5V) at time T3. After the VDDIO signal reaches the medium threshold voltage 1110 the signal VREFN_FS shows a slight dip and increases along with the increase of VDDIO during the time interval T3 to T4. The signal VNST is similar to the signal VREFN_FS. The drain to gate signal VDG(N1) of device N1 does not cross the stress limit 1120 (e.g., 1.65V) during the ramp up and ramp down of VDDIO. Similarly the drain to source signal VDS(N1) of device N1 never crosses the stress limit 1130 (e.g., 1.65V). This is so because the VREFN_FS signal does not drop to a low voltage value due to the supply and failsafe detector 610.

The voltage clipping circuit receives the VDDIO_DET signal as input and generates a VDDIO_DET_REFN signal that is provided as input to the multiplexer 700 shown in FIG. 7 for generating the VREFN_FS signal that is provided as input to the devices of the I/O circuit, for example, the device N1 shown in FIG. 6.

Figure 12:
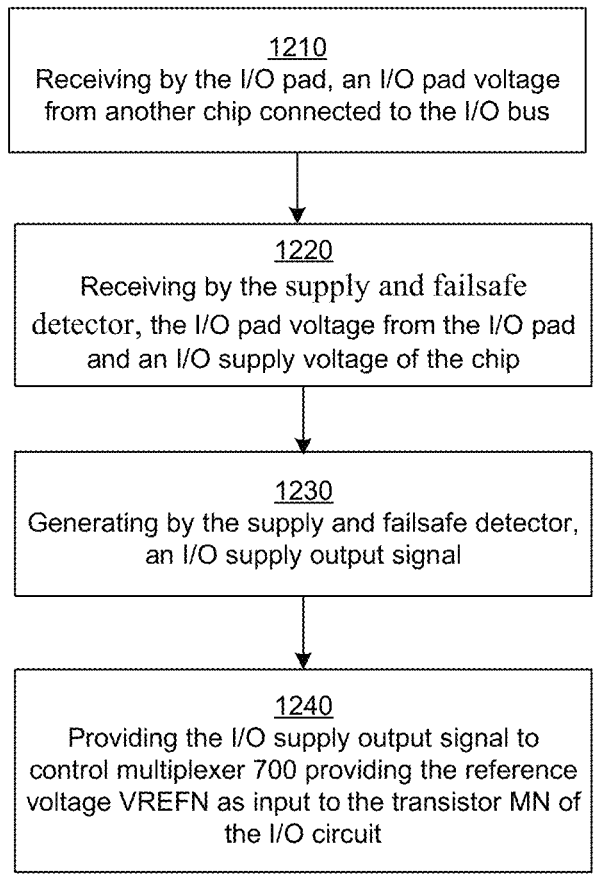
FIG. 12 is a flowchart illustrating the process of generating signals for performing failsafe protection of high voltage tolerant I/O, in accordance with an embodiment.

FIG. 12 is a flowchart illustrating the process of generating signals for performing failsafe protection of high voltage tolerant I/O, in accordance with an embodiment. The I/O pad of the I/O circuit receives 1210 an I/O pad voltage.

The I/O pad is connected to a bus connected to one or more other chips and the I/O pad voltage is provided by one of the one or more other chips.

The supply and failsafe detector receives 1220 the I/O pad voltage from the I/O pad and an I/O supply voltage (VDDIO) of the chip. The supply and failsafe detector generates 1230 an I/O supply output signal (VDDIO_DET). The I/O supply output signal has a low voltage value when the I/O supply voltage of the chip is below a medium voltage level. The I/O supply output signal has a high voltage value when the I/O supply voltage of the chip is above the medium voltage level. The medium voltage is above a threshold voltage VTH of the transistor MN of the I/O circuit and below the high voltage value. The failsafe control and bias signal generator provides 1240 the I/O supply output signal to control a multiplexers (as 700) providing a reference voltage (as VREFN_FS) as input to the transistor of the I/O circuit.

Figure 13:
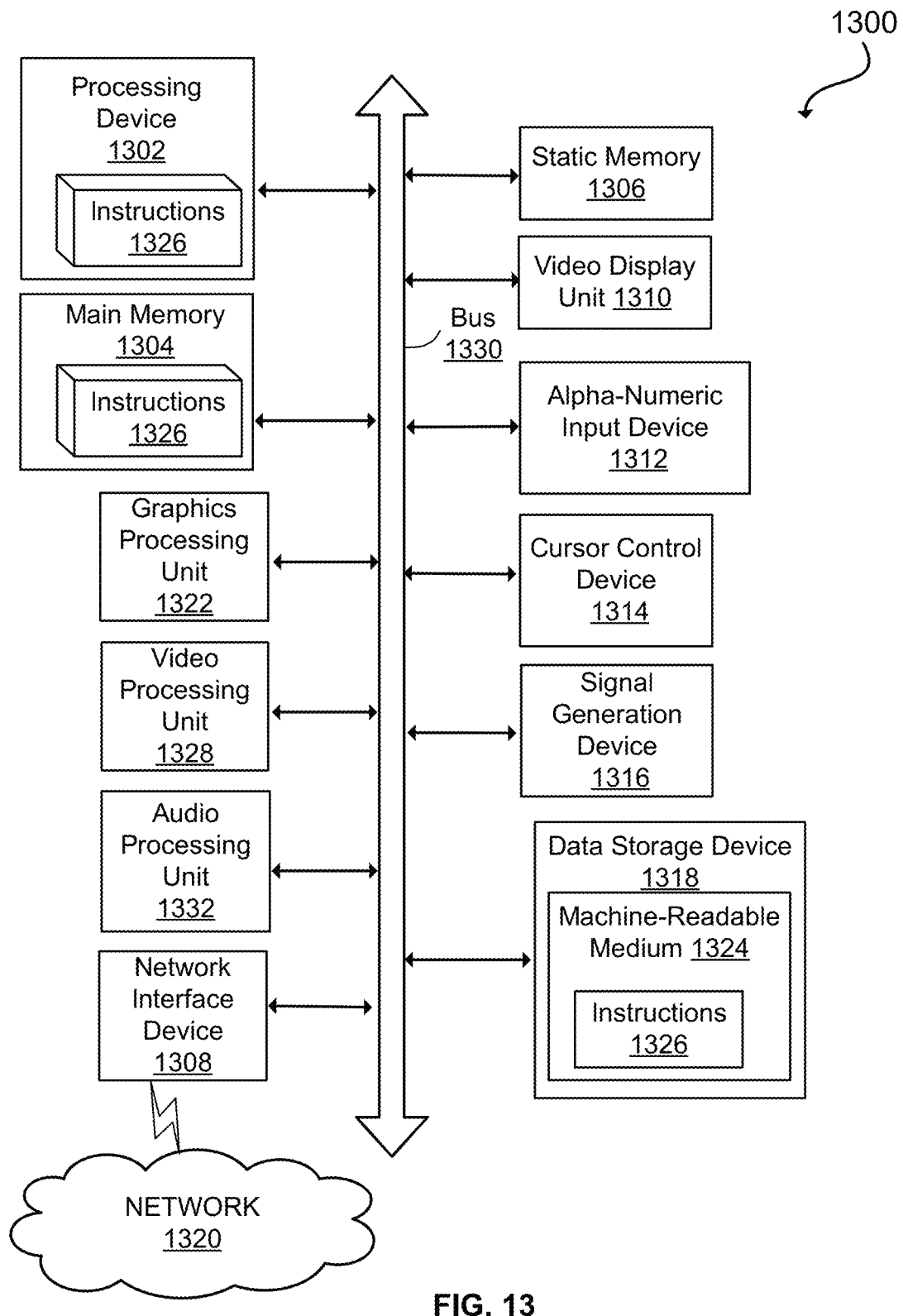
FIG. 13 illustrates an example machine of a computer system within which a set of instructions, for causing the machine to perform any one or more of the methodologies discussed herein, may be executed.

FIG. 13 illustrates an example machine of a computer system within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM), a static memory 1306 (e.g., flash memory, static random access memory (SRAM), etc.), and a data storage device 1318, which communicate with each other via a bus 1330.

Processing device 1302 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. The processing device 1302 may be configured to execute instructions 1326 for performing the operations and steps described herein.

The computer system 1300 may further include a network interface device 1308 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 1318 may include a machine-readable storage medium 1324 (also known as a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304 and the processing device 1302 also constituting machine-readable storage media.

In some implementations, the instructions 1326 include instructions to implement functionality corresponding to the present disclosure. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1302 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit of a chip, comprising:
   an I/O circuit comprising a transistor connected to an I/O pad, wherein the I/O pad is connected to one or more other chips via an I/O bus;
   a supply and failsafe detector component comprising:
      a first input connected to an I/O supply voltage of the chip,
      a second input connected to the I/O pad and receiving an I/O pad voltage as supply,
      an I/O supply output signal generated by the supply and failsafe detector component, the I/O supply output signal having a low voltage value when the I/O supply voltage of the chip is below a medium voltage level and the I/O supply output signal having a high voltage value when the I/O supply voltage of the chip is above the medium voltage level, wherein the medium voltage level is above a threshold voltage of the transistor of the I/O circuit and below the high voltage value; and
   a multiplexer controlled by the I/O supply output signal, the multiplexer providing a reference voltage as input to the transistor of the I/O circuit.

2. The circuit of claim 1, wherein the supply and failsafe detector component comprises:
   a first inverter including a first inverter input and a first inverter output, wherein the first inverter output is high when the first inverter input is below the medium voltage level and the first inverter output is low when the first inverter input is above the medium voltage level.

3. The circuit of claim 2, wherein the first inverter receives the I/O supply voltage of the chip and the I/O pad voltage as a supply voltage.

4. The circuit of claim 2, wherein the supply and failsafe detector component further comprises:
   a second inverter receiving the output of the first inverter as input, the second inverter including an inverter input and an inverter output (VDDIO_DET), wherein the inverter output of the second inverter is high when the first inverter input is below the medium voltage level and the second inverter output is low when the first inverter input is above the medium voltage level.

5. The circuit of claim 4, wherein the second inverter receives the I/O supply voltage (VDDIO) as a power supply.

6. The circuit of claim 4, wherein the supply and failsafe detector component further comprises:
   a voltage clipping circuit that receives the inverter output of the second inverter and generates a reference voltage that is lower than the output of the second inverter.

7. The circuit of claim 6, wherein the multiplexer further receives as input, the reference voltage generated by the voltage clipping circuit.

8. The circuit of claim 1, further comprising:
   a voltage divider receiving the I/O pad voltage supply and generating the reference voltage from the I/O pad voltage supply when the I/O supply voltage of the chip has a low voltage value.

9. A non-transitory computer readable storage medium storing a digital representation of a circuit of a chip, comprising:
   an I/O circuit comprising a transistor connected to an I/O pad, wherein the I/O pad is connected to one or more other chips via an I/O bus;
   a supply and failsafe detector component comprising:
      a first input connected to an I/O supply voltage of the chip,
      a second input connected to the I/O pad and receiving an I/O pad voltage as supply,
      an I/O supply output signal generated by the supply and failsafe detector component, the I/O supply output signal having a low voltage value when the I/O supply voltage of the chip is below a medium voltage level and the I/O supply output signal having a high voltage value when the I/O supply voltage of the chip is above the medium voltage level, wherein the medium voltage level is above a threshold voltage of the transistor of the I/O circuit and below the high voltage value; and
   a multiplexer controlled by the I/O supply output signal, the multiplexer providing a reference voltage as input to the transistor of the I/O circuit.

10. The non-transitory computer readable storage medium of claim 9, wherein the supply and failsafe detector component comprises:
    a first inverter including a first inverter input and a first inverter output, wherein the first inverter output is high when the first inverter input is below the medium voltage level and the first inverter output is low when the first inverter input is above the medium voltage level.

11. The non-transitory computer readable storage medium of claim 10, wherein the first inverter receives the I/O supply voltage of the chip and the I/O pad voltage as a supply voltage.

12. The non-transitory computer readable storage medium of claim 10, wherein the supply and failsafe detector component further comprises:
- a second inverter receiving the output of the first inverter as input, the second inverter including an inverter input and an inverter output (VDDIO_DET), wherein the inverter output of the second inverter is high when the first inverter input is below the medium voltage level and the second inverter output is low when the first inverter input is above the medium voltage level.

13. The non-transitory computer readable storage medium of claim 12, wherein the second inverter receives the I/O supply voltage (VDDIO) as a power supply.

14. The non-transitory computer readable storage medium of claim 12, wherein the supply and failsafe detector component further comprises:
- a voltage clipping circuit that receives the inverter output of the second inverter and generates a reference voltage that is lower than the output of the second inverter.

15. The non-transitory computer readable storage medium of claim 14, wherein the multiplexer further receives as input, the reference voltage generated by the voltage clipping circuit.

16. The non-transitory computer readable storage medium of claim 9, wherein the circuit further comprises:
- a voltage divider receiving the I/O pad voltage supply and generating the reference voltage from the I/O pad voltage supply when the I/O supply voltage of the chip has a low voltage value.

17. A method for fail safe protection of an input/output (I/O) circuit of a chip, the method comprising:
- receiving by an I/O pad of the I/O circuit, I/O pad voltage, wherein the I/O pad is connected to a bus connected to one or more other chips, wherein the I/O pad voltage is provided by one of the one or more other chips;
- receiving by a supply and failsafe detector, the I/O pad voltage from the I/O pad and an I/O supply voltage of the chip as supply;
- generating by the supply and failsafe detector, an I/O supply output signal having a low voltage value when the I/O supply voltage of the chip is below a medium voltage level and the I/O supply output signal having a high voltage value when the I/O supply voltage of the chip is above the medium voltage level, wherein the medium voltage level is above a threshold voltage of a transistor of the I/O circuit and below the high voltage value; and
- providing the I/O supply output signal to control a multiplexer providing a reference voltage as input to the transistor of the I/O circuit.

18. The method of claim 17, wherein the supply and failsafe detector comprises a first inverter including a first inverter input and a first inverter output, the method further comprising:
- generating a first inverter output, wherein the first inverter output is high when the first inverter input is below the medium voltage level and the first inverter output is low when the first inverter input is above the medium voltage level.

19. The method of claim 18, wherein the supply and failsafe detector further comprises a second inverter receiving the I/O supply voltage as a power supply, the second inverter receiving the output of the first inverter as input, the method further comprising:
- generating by the second inverter, an inverter output, wherein the inverter output of the second inverter is high when the first inverter input is below the medium voltage level and the second inverter output is low when the first inverter input is above the medium voltage level.

20. The method of claim 19, wherein the supply and failsafe detector further comprises, a voltage clipping circuit that receives the inverter output of the second inverter, the method further comprising:
- generating by the voltage clipping circuit, a reference voltage that is lower than the output of the second inverter.

* * * * *